United States Patent
Kim et al.

(10) Patent No.: US 11,747,721 B2
(45) Date of Patent: Sep. 5, 2023

(54) METHOD OF FORMING SHAPE ON MASK BASED ON DEEP LEARNING, AND MASK MANUFACTURING METHOD USING THE METHOD OF FORMING THE SHAPE ON MASK

(71) Applicant: SAMSUNG ELECTRONICS CO., LTD., Suwon-si (KR)

(72) Inventors: Useong Kim, Hwaseong-si (KR); Mincheol Kang, Hwaseong-si (KR); Woojoo Sim, Hwaseong-si (KR)

(73) Assignee: Samsung Electronics Co., Ltd.

( * ) Notice: Subject to any disclaimer, the term of this patent is extended or adjusted under 35 U.S.C. 154(b) by 305 days.

(21) Appl. No.: 17/154,279

(22) Filed: Jan. 21, 2021

(65) Prior Publication Data
US 2022/0035236 A1 Feb. 3, 2022

(30) Foreign Application Priority Data
Jul. 29, 2020 (KR) ........................ 10-2020-0094795

(51) Int. Cl.
*G03F 7/20* (2006.01)
*G06N 3/08* (2023.01)
*G03F 1/36* (2012.01)
*G03F 7/00* (2006.01)
*H01L 21/027* (2006.01)

(52) U.S. Cl.
CPC ............ *G03F 1/36* (2013.01); *G03F 7/70308* (2013.01); *G03F 7/70441* (2013.01); *G06N 3/08* (2013.01); *H01L 21/027* (2013.01)

(58) Field of Classification Search
CPC .... G03F 1/36; G03F 7/70308; G03F 7/70441; G03F 1/70; G03F 1/76; G06N 3/08; G06N 3/045; G06N 3/047; G06N 3/088; H01L 21/027; G06T 3/4007; G06T 5/001
See application file for complete search history.

(56) References Cited

U.S. PATENT DOCUMENTS

| | | | |
|---|---|---|---|
| 7,703,049 B2 | 4/2010 | Abrams et al. | |
| 10,209,615 B2 | 2/2019 | Li et al. | |
| 10,606,975 B2 | 3/2020 | Sha et al. | |
| 2004/0251430 A1* | 12/2004 | Sandstrom | G03F 7/70283 250/492.2 |
| 2008/0077907 A1 | 3/2008 | Kulkami | |

(Continued)

FOREIGN PATENT DOCUMENTS

KR 20200035303 A 4/2020

*Primary Examiner* — Nghia M Doan
(74) *Attorney, Agent, or Firm* — Myers Bigel, P.A.

(57) ABSTRACT

Provided are a method of forming a mask, the method accurately and quickly restoring an image on the mask to the shape on the mask, and a mask manufacturing method using the method of forming the shape. The method of forming a mask includes obtaining first images by performing rasterization and image correction on shapes on the mask corresponding to first patterns on a wafer, obtaining second images by applying a transformation to the shapes on the mask, performing deep learning based on a transformation relationship between ones of the first images and ones of the second images corresponding to the first images, and forming a target shape on the mask corresponding to a target pattern on the wafer, based on the deep learning. The mask is manufactured based on the target shape on the mask.

20 Claims, 9 Drawing Sheets

(56) References Cited

U.S. PATENT DOCUMENTS

| | | | |
|---|---|---|---|
| 2017/0277813 A1* | 9/2017 | Cai | G06F 30/398 |
| 2019/0147134 A1 | 5/2019 | Wang et al. | |
| 2020/0050099 A1 | 2/2020 | Su et al. | |
| 2020/0278604 A1* | 9/2020 | Lo | H01L 21/0274 |
| 2020/0356011 A1 | 11/2020 | Su et al. | |
| 2021/0181620 A1* | 6/2021 | Poonawala | G03F 7/70441 |

* cited by examiner

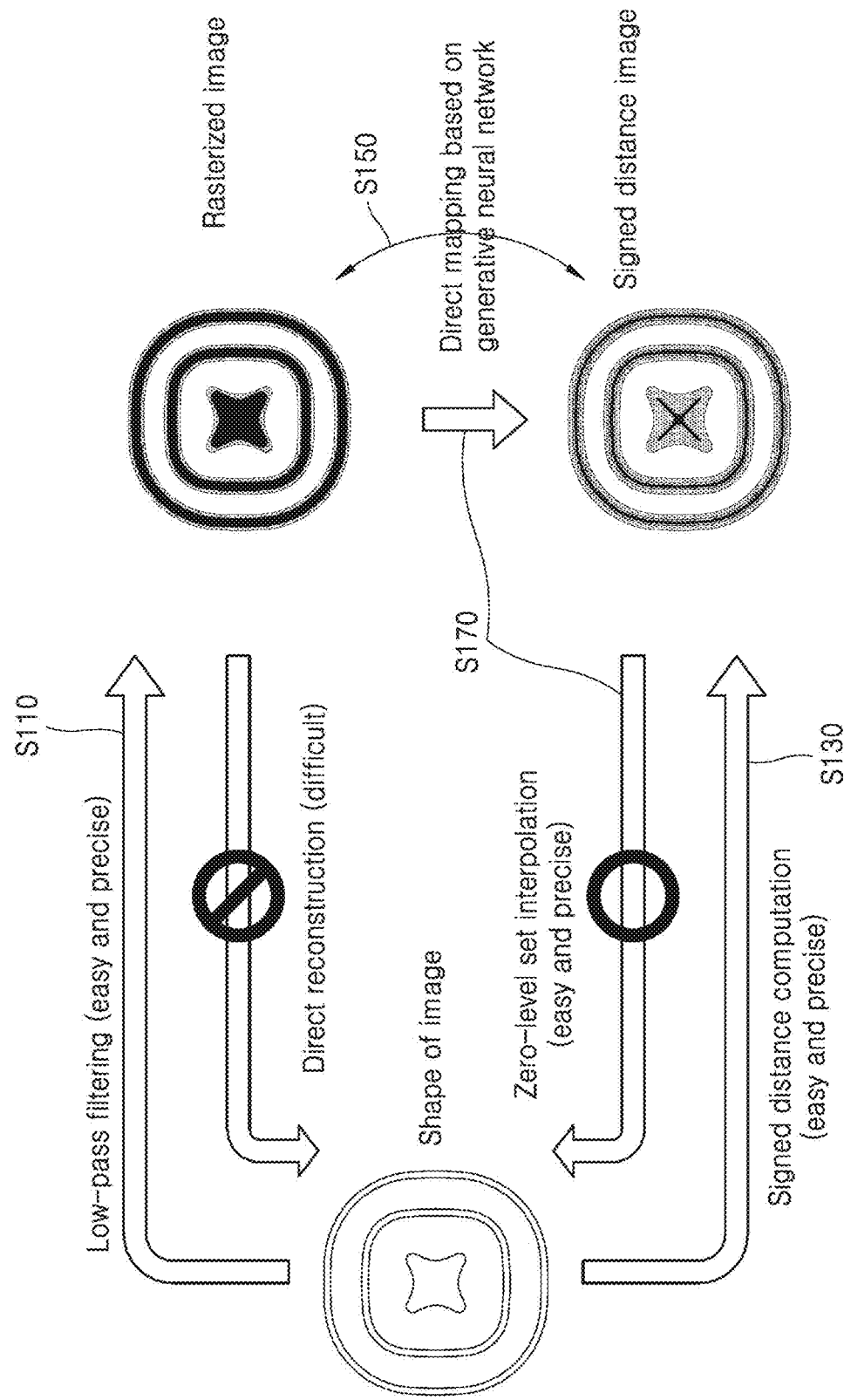

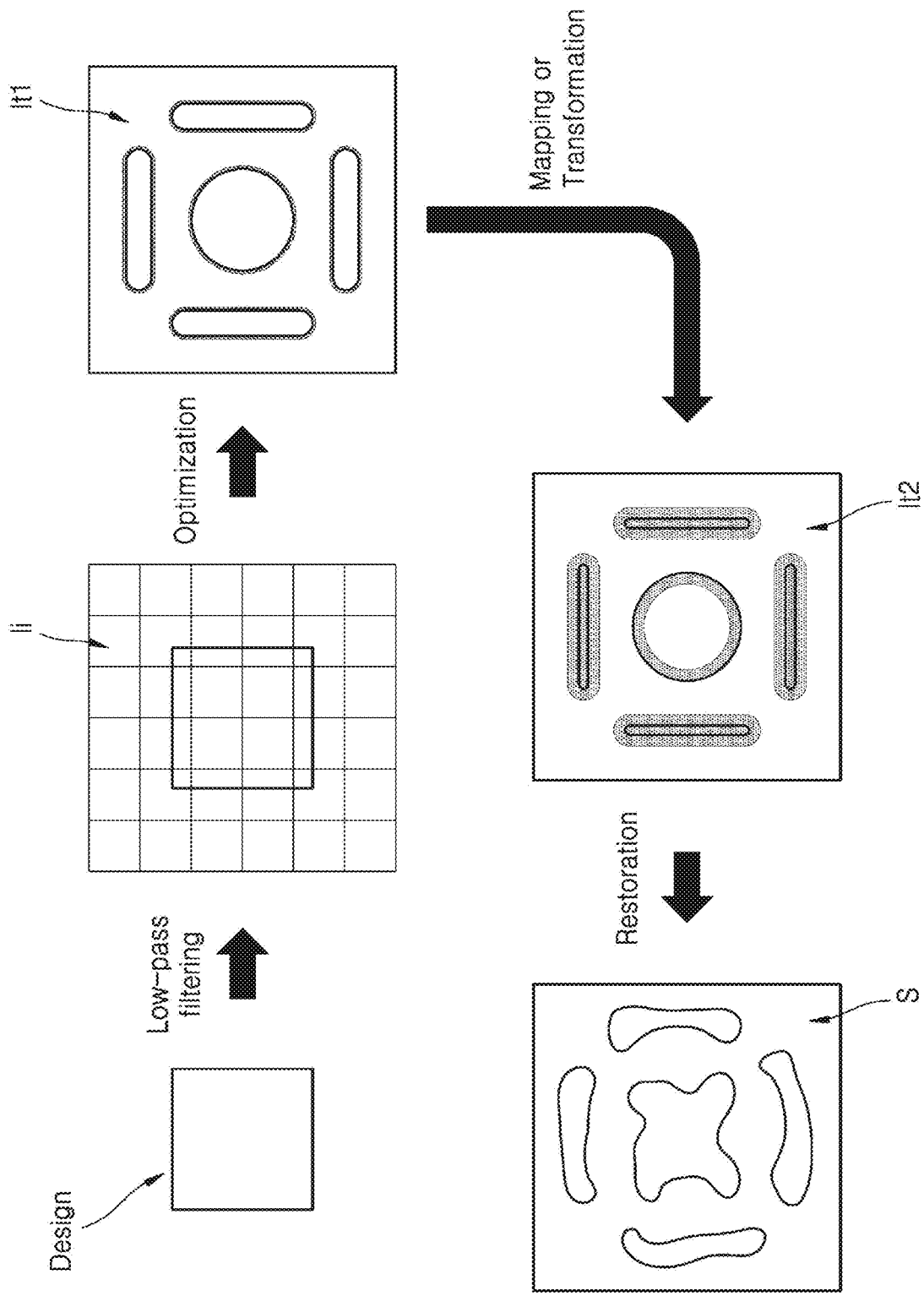

RI

SDI1 by Deep Learning

SDI2 by SDC

METHOD OF FORMING SHAPE ON MASK BASED ON DEEP LEARNING, AND MASK MANUFACTURING METHOD USING THE METHOD OF FORMING THE SHAPE ON MASK

CROSS-REFERENCE TO RELATED APPLICATION

This application is based on and claims priority under 35 U.S.C. § 119 to Korean Patent Application No. 10-2020-0094795, filed on Jul. 29, 2020, in the Korean Intellectual Property Office, the disclosure of which is incorporated by reference herein in its entirety.

BACKGROUND

The inventive concept relates to a mask manufacturing method, and more particularly, to a method of forming a shape on a mask, and a mask manufacturing method using the method of forming the shape on the mask.

In a semiconductor process, a photolithography process using a mask may be performed to form a pattern on a semiconductor substrate such as a wafer. The mask may be a pattern transfer body in which a pattern shape of an opaque material is formed on a transparent base material. When briefly describing a process of manufacturing a mask, first, a required circuit is designed and a layout of the circuit is designed, and then mask design data obtained via optical proximity correction (OPC) is transmitted as mask tape-out (MTO) design data. Thereafter, a mask data preparation (MDP) is performed based on the MTO design data, and a front end of line (FEOL) such as an exposure process and a back end of line (BEOL) such as a defect test are performed to manufacture the mask.

SUMMARY

The inventive concept provides a method of forming a mask, the method accurately and quickly restoring an image on the mask to a shape on the mask, and a mask manufacturing method using the method of forming the mask.

According to an aspect of the inventive concept, there is provided a method of forming a mask that includes obtaining first images by performing rasterization and image correction on shapes on the mask corresponding to first patterns on a wafer, obtaining second images by applying a transformation to the shapes on the mask, performing deep learning based on a transformation relationship between ones of the first images and ones of the second images corresponding to the first images, forming a target shape on the mask corresponding to a target pattern on the wafer, based on the deep learning, and manufacturing the mask based on the target shape on the mask.

According to another aspect of the inventive concept, there is provided a method of forming a mask, the method including designing initial shapes on the mask corresponding to first patterns on a wafer, obtaining first images that have a bitmap format by performing rasterization and image correction on the initial shapes, obtaining signed distance images by applying a signed distance computation to the initial shapes on the mask corresponding to the first patterns on the wafer, performing deep learning with respect to a transformation relationship between ones of the first images and ones of the signed distance images corresponding to the first images, transforming an initial shape of the initial shapes on the mask corresponding to a target pattern on the wafer into a target first image by performing rasterization and image correction on the initial shape on the mask corresponding to the target pattern on the wafer, transforming the target first image into a target signed distance image, based on the deep learning, transforming the target signed distance image into a target shape on the mask, and manufacturing the mask comprising the target shape on the mask.

According to another aspect of the inventive concept, there is provided a mask manufacturing method including obtaining first images by performing rasterization and image correction on shapes on a mask corresponding to first patterns on a wafer, obtaining second images by applying a transformation to the shapes on the mask, performing deep learning with respect to a transformation relationship between ones of the first images and ones of the second images corresponding to the first images, forming a target shape on the mask corresponding to a target pattern on the wafer, based on the deep learning, transmitting the target shape as MTO design data, preparing for mask data, based on the MTO design data, and performing exposure on a mask substrate of the mask, based on the mask data.

BRIEF DESCRIPTION OF THE DRAWINGS

Example embodiments of the inventive concept will be more clearly understood from the following detailed description taken in conjunction with the accompanying drawings in which:

FIGS. 2A and 2B are a conceptual diagram and simulation illustrations for explaining the principle of the method of FIG. 1 of forming the shape on the mask;

FIG. 4 is a conceptual diagram for explaining operations of FIGS. 3A and 3B of forming the target shape on the mask;

DETAILED DESCRIPTION

Figure 1:
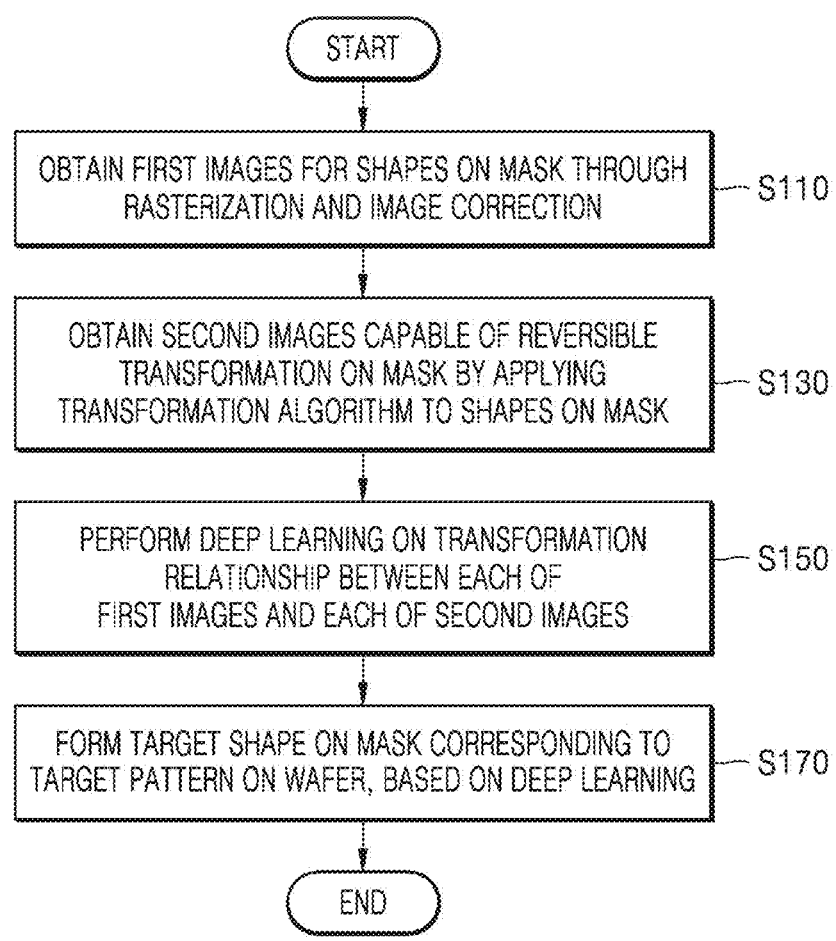
FIG. 1 is a flowchart of a method of forming a shape on a mask, according to some embodiments of the inventive concept.

Embodiments will now be described more fully with reference to the accompanying drawings. In the accompanying drawings, like reference numerals may refer to like elements, and repeated descriptions of the like elements will be omitted.

FIG. 1 is a flowchart of a method of forming a shape on a mask, according to some embodiments of the inventive concept.

Referring to FIG. 1, in the method of forming a shape on a mask, first images for shapes on a mask are obtained through rasterization and image correction (S110). A shape on a mask (hereinafter, referred to as 'a mask shape') may refer to patterns on a mask for use in an exposure process expressed in a vector format such as GDSII (Graphic Data System II) or OASIS (Open Artwork System Interchange Standard), in order to form patterns required on a wafer, for example, first patterns. The mask shape in the vector format such as GDSII/OASIS may generally have resolution of about 0.1 nm. For example, the mask shape may have a format of a resolution of about 0.05 nm or about 0.1 nm.

By reference, pixel-based optical proximity correction (OPC) or inverse lithography technology (ILT), which is employed in a mask manufacturing process, may include a formation or restoration technique of a mask shape. The formation technique of the mask shape may refer to a technique of performing optimization on an image on a mask (hereinafter, referred to as a mask image) by using ILT and then reconstructing a mask shape in the vector format such as GDSII/OASIS from the mask image without loss of precision. The optimization is a process of correcting the mask image into a mask image optimized for a required target pattern, and is also referred to as an image correction process. Hereinafter, the image correction process is unified and used as optimization.

In the optimization of the mask image by using ILT, optimization is generally conducted after pixelating the mask shape stored in a format such as GDSII/OASIS and parametrizing the pixelated mask shape with transmittance to change the mask shape into a mask image having a bitmap format. A format such as GDSII/OASIS is a format having a resolution of 0.05 nm or 0.1 nm as described above, and a mask shape expressed in the format such as GDSII/OASIS may be one where a portion having a polygon has a value of 1 and a portion having no polygons has a value of 0. However, a pixelated mask image has a bitmap format, and may generally have a resolution of several nanometers or greater due to a limitation of the storage capacity of a memory. Accordingly, transforming the mask shape in the format such as GDSII/OASIS into a mask image in the bitmap format may correspond to down sampling from the viewpoint of digital signal processing.

To optimize or improve a mask image, it is important to accurately calculate the intensity of light that has passed through a mask on a wafer. To this end, a spatial frequency of the mask shape needs to be accurately calculated within a specific frequency band. Accordingly, an aliasing effect due to a high spatial frequency may be removed by applying a low-pass filter before down-sampling the mask shape to the mask image. Finally, the pixelated mask image may be obtained through down sampling after applying a low-pass filter to the mask shape in the format such as GDSII/OASIS.

Thereafter, as described above, an initial mask image may be generated by parametrizing the pixelated mask image. A final mask image may be generated by performing optimization on the parametrized initial mask image. Both the initial mask image and the final mask image may have the bitmap format, similar to the pixelated mask image. The first images may correspond to the final mask image, and accordingly, may have the bitmap format. By reference, low-pass filtering, down sampling, and/or parametrization may be referred to as rasterization.

After the final mask image is generated, the final mask image needs to be restored to the mask shape in the format such as GDSII/OASIS. This restoration may be very difficult or almost impossible. In other words, as described above, because a process of creating the mask image in the bitmap format from the mask shape in the format such as GDSII/OASIS employs 'low-pass filtering+down sampling', the process may be an irreversible transformation process. Thus, an independent iterative optimization process is separately needed to accurately restore a mask shape having a resolution of about 0.1 nm from a mask image having a resolution of about several nanometers or greater. This independent iterative optimization process may be very difficult to realize and may not actually be applied.

In such an existing ILT method of directly parametrizing transmittance, there are not methods of quickly and accurately restoring a mask shape from a mask image, and thus a precise curvilinear shape may not be restored. Accordingly, a method of conducting additional optimization or improvements by guessing an initial condition from a rectangular shape, a simple manhattan shape, or the like and then changing a transmittance-based parametrization method to a segment-based parametrization method may be used. Consequently, the following three problems may be generated.

The first problem is that, because a curvilinear shape is not restored, ILT optimization performance may decrease. The second problem is that difficulty of optimization may increase due to the use of a segment-based parametrization method with respect to the mask shape. The third problem is that a restoration speed may decrease because of additional optimization.

In the mask shape forming method according to some embodiments of the inventive concept, a mask shape may be accurately and quickly restored by obtaining second images capable of reversible transformation through a transformation algorithm, which will be described below, and performing deep learning with respect to a transformation relationship between the first images and the second images. Accordingly, problems of an existing ILT method may be addressed. The second image obtainment through the transformation algorithm and the deep learning will now be described in more detail.

After the first images are obtained, the second images capable of reversible transformation may be obtained by applying the transformation algorithm to the mask shapes (S130). The transformation algorithm may be, for example, an Euclidean distance computation or signed distance computation (SDC) algorithm. The second images may be signed distance images (SDIs) generated through the SDC algorithm. The signed distance image may correspond to a mask image having a sort of bitmap format and capable of reversible transformation. Being capable of reversible transformation may refer to easily and precisely transforming from a mask image to a mask shape through interpolation. For example, a signed distance image may be easily and accurately restored to a mask shape through zero-level set interpolation.

By reference, the SDC algorithm is an algorithm of calculating an absolute value of a shortest distance from the contour of a mask shape with each pixel value and a sign indicating the inside or outside of the mask shape. The signed distance image may refer to an image storing the calculated sign and the calculated absolute value in each pixel value. Accordingly, when the sign and the absolute value stored in the signed distance image are used, the mask shape may be accurately restored. A representative example of a method of restoring a mask shape from a signed distance image is a marching squares algorithm in a two-dimensional (2D) dimension. For example, the aforementioned zero-level set interpolation may be based on the marching squares algorithm.

Although the SDC algorithm has been illustrated and described above as the transformation algorithm, the transformation algorithm is not limited to the SDC algorithm. For example, the transformation algorithm may include all types of algorithms capable of transforming a mask shape into a mask image in the bitmap format capable of reversible transformation.

The order of the obtainment of the first images and the obtainment of the second images may be reversed. The obtainment of the first images and the obtainment of the second images may be simultaneously performed. In addition, as will be described later with reference to FIG. 2B, the first images and the second images may be obtained from already-known mask shapes. However, the first images may be obtained from unknown mask shapes. When the first images are obtained from the unknown mask shapes, the obtainment of the first images and mask shapes according thereto may be determined through additional iterative optimization. The second images corresponding to the first images may be obtained by applying the transformation algorithm to the mask shapes determined as described above.

After the second images are obtained, deep learning may be performed on a transformation relationship between each of the first images and each of the second images corresponding to the first images (S150). A transformation model between a first image and a second image may be inferred through deep learning. Deep learning may use, for example, a generative neural network algorithm.

The generative neural network algorithm may be included in an unsupervised learning algorithm of performing learning when no answers are given. By reference, a representative example of unsupervised learning is clustering that refers to ascertaining the characteristics of data even when no answers are given and grouping similar data. For example, animal pictures including a cat and a giraffe may be shown to a person A who is not familiar with animals. Even when person A is not informed of what picture is a cat and what picture is a giraffe, person A may distinguish an animal having a spotted pattern and a long neck from the other animals. In other words, unsupervised learning refers to ascertaining a pattern by oneself by learning the characteristics of data not given with answers.

A generative neural network enables a probability distribution having original data to be estimated, and enables an artificial neural network to create the probability distribution. Thus these neural networks are different from simple clustering-based unsupervised learning. To understand the generative neural network, the concept of the probability distribution needs to be understood, because pieces of data handled by the generative neural network are random variables having a probability distribution. When an unknown quantity x in a second order equation is a variable, the unknown quantity x becomes a specific number by solving the second order equation. The random variable produces different values in every measurement but produces a number following a specific probability distribution. Thus, knowing the probability distribution for the random variable may be the same as being able to understand the entire random variable, namely, the entire data.

For example, when the probability distribution is known, a prediction expected value of the data, a dispersion of the data, and the like may be directly ascertained, and thus statistical characteristics of the data may be directly analyzed. Moreover, when data is arbitrarily generated to follow a given probability distribution, the data may have similar characteristics to the original data used to obtain the probability distribution. In other words, when the probability distribution for the data is enabled to be modelled through an algorithm capable of unsupervised learning, such as the generative neural network, infinitely many pieces of data that accurately share the probability distribution with the original data may be newly generated.

For example, in the mask shape forming method according to some embodiments, a probability distribution for the transformation relationship between the first images and the second images may be modelled by learning a transformation relationship between the first images and the second images through deep learning using the generative neural network algorithm. Accordingly, a second image may be directly generated based on a first image and the modelled probability distribution. The probability distribution may correspond to a transformation model between the first image and the second image. In other words, the transformation relationship between the first images and the second images is learned through deep learning using the generative neural network algorithm, thereby inferring a transformation model and directly generating a second image corresponding to a new first image by using the inferred transformation model. In addition, as the number of first images for use in deep learning and the number of second images corresponding to the first images increase, the inferred transformation model may more precisely represent the transformation relationship between the first images and the second images. Also, a second image corresponding to a new first image may be more precisely generated based on the inferred transformation model.

Although the generative neural network algorithm has been described above as an algorithm for use in deep learning, an algorithm for use in deep learning in the mask shape forming method according to some embodiments is not limited thereto. For example, various types of algorithms for inferring a model for the transformation relationship between the first images and the second images may be used in deep learning of the mask shape forming method, according to some embodiments.

Figure 3A:
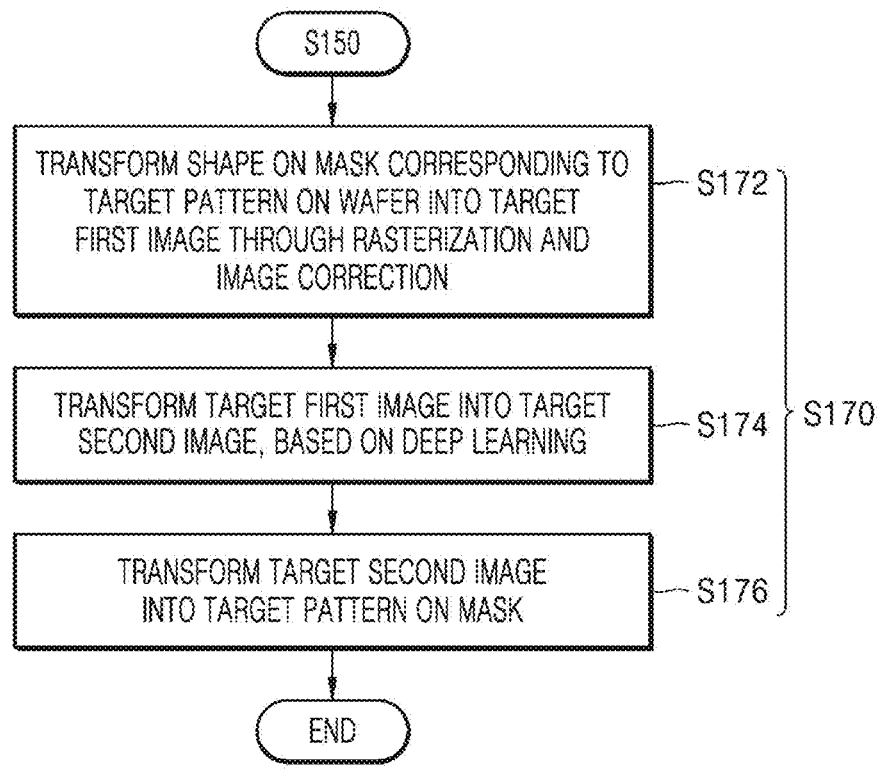
FIGS. 3A and 3B are flowcharts of operations of forming a target shape on the mask, included in the method of FIG. 1 of forming the shape on the mask.
Figure 3B:
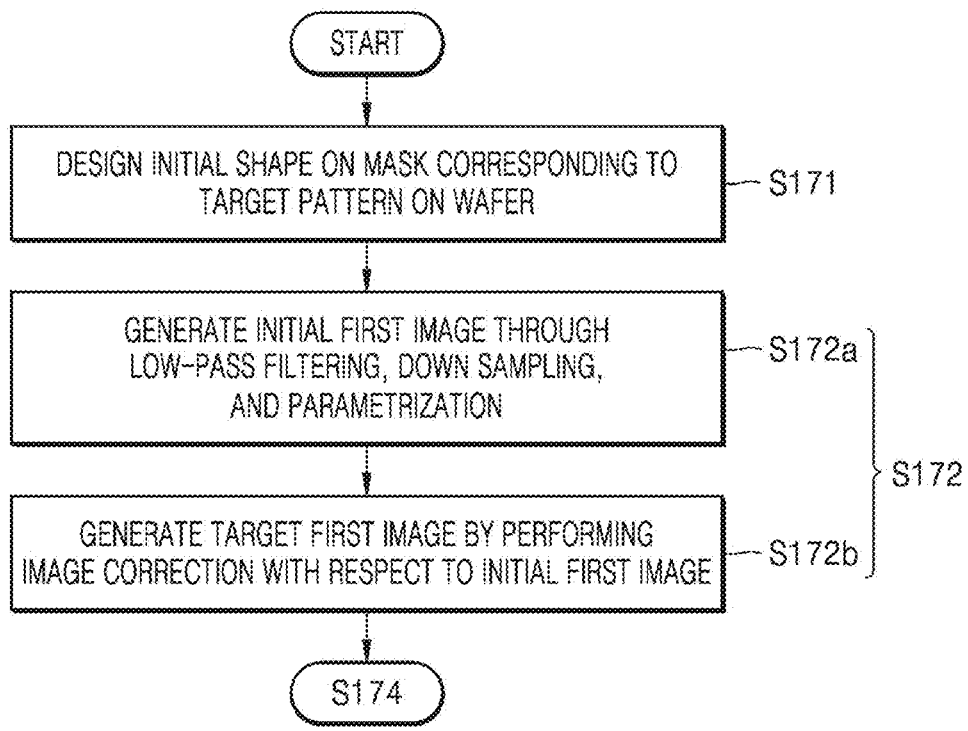

After deep learning is performed, a target shape on the mask corresponding to a target pattern on a wafer is formed based on deep learning (S170). In detail, by applying a transformation model inferred through deep learning to a target first image corresponding to the target pattern on the wafer, a target second image is generated. The target second image is restored to the target shape on the mask, and thus the target shape on the mask may be quickly and accurately restored without additional iterative optimization. In addition, the target shape on the mask may include a curvilinear shape. Consequently, in the mask shape forming method according to some embodiments, a mask image corresponding to the target pattern on the wafer may be accurately and quickly restored to the mask shape through the above-described processes. Operation S170 of forming the target shape on the mask corresponding to the target pattern on the wafer will be described in more detail when FIGS. 3A and 3B are described later.

In the mask shape forming method according to some embodiments of the inventive concept, the target shape on the mask, namely, the mask shape, may be accurately and quickly restored by obtaining the first images through rasterization and optimization, obtaining the second images capable of reversible transformation through the transformation algorithm, inferring a transformation model for the transformation relationship between the first images and the second images through deep learning, and generating the target second image by applying the transformation model to the mask image corresponding to the target pattern. In other words, in the mask shape forming method according to some embodiments of the inventive concept, the mask shape may be accurately and quickly restored from the mask image through one model inference using deep learning, without additional iterative optimization. Therefore, the mask shape forming method according to some embodiments may address all of the three problems generated when the existing ILT method of directly parametrizing transmittance is used.

Figure 2B:
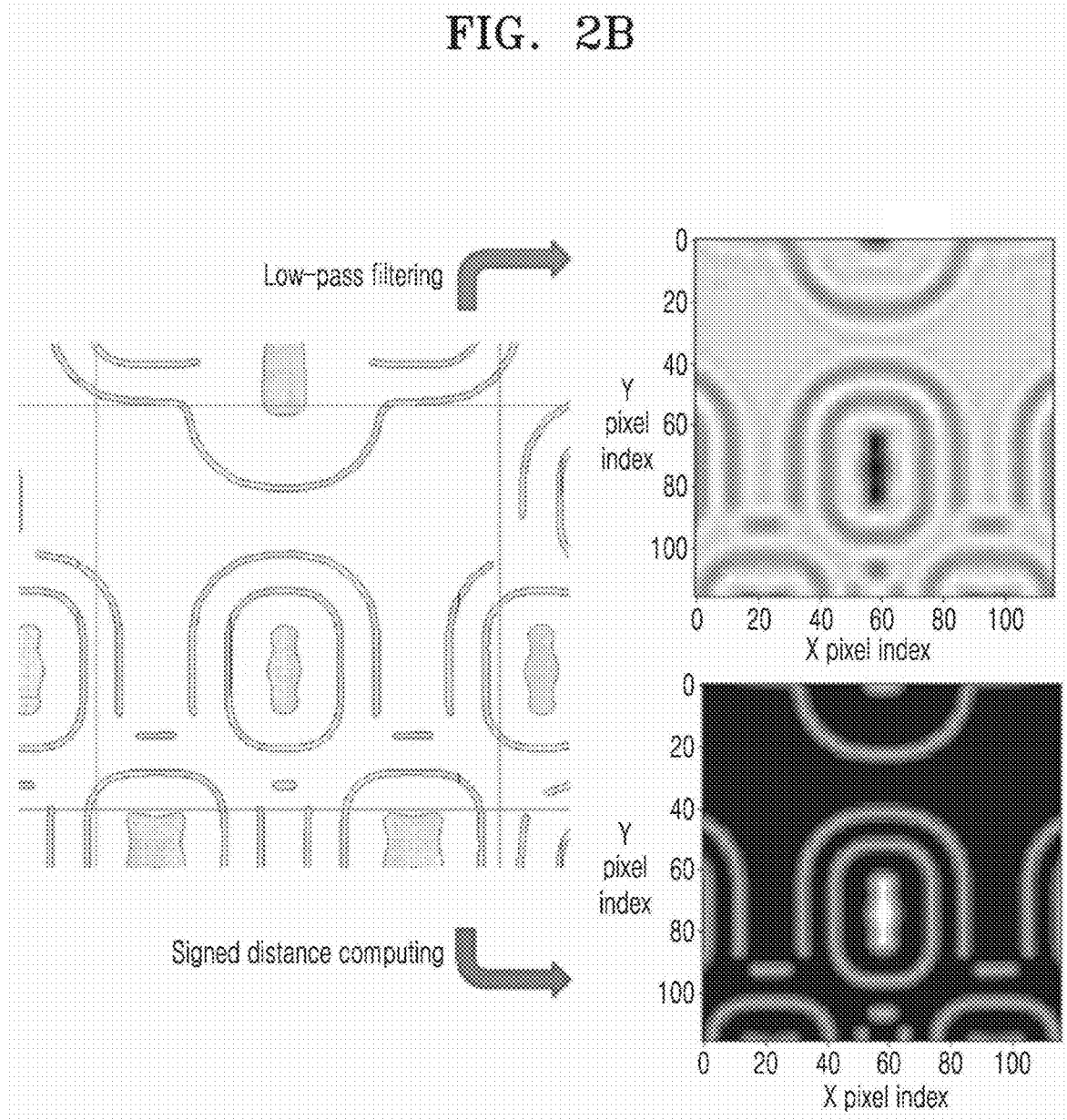

FIGS. 2A and 2B are a conceptual diagram and simulation illustrations for explaining the principle of the mask shape forming method of FIG. 1. Descriptions of FIGS. 2A and 2B which are the same as the description of FIG. 1 are given briefly or omitted herein.

Referring to FIG. 2A, when the left illustration is a mask shape in the format such as GDSII/OASIS, a rasterized image may be generated through rasterization and optimization as indicated by an upper arrow heading rightwards. A process of generating the rasterized image may correspond to operation S110 of FIG. 1 of generating the first images. Accordingly, the first images may correspond to the rasterized image. As described above, rasterization may include low-pass filtering, down sampling, and/or parametrization. Generation of the rasterized image may include optimization. However, for convenience of explanation, FIG. 2A illustrates only low-pass filtering on the upper arrow heading rightwards.

As described above, the rasterized image has a bitmap format of irreversible transformation, and thus it may be difficult or impossible to restore the rasterized image to the mask shape. Accordingly, the restoration from the rasterized image to the mask shape may need additional iterative operations that attempt to optimize or improve the restored mask shape.

As indicated by a lower arrow heading rightwards, a signed distance image may be generated from the mask shape by using the SDC algorithm. A process of generating the signed distance image may correspond to operation S130 of FIG. 1 of generating the second images. Accordingly, the second images may correspond to the signed distance image. As described above, the signed distance image may have a bitmap format of reversible transformation, and thus it may be easy and/or accurate to restore the signed distance image to the mask shape.

As for an unknown new mask shape, the signed distance image may not be generated, and only the rasterized image may be generated. In other words, when a new target pattern is to be formed on a wafer, a mask shape corresponding to the target pattern may not be directly ascertained, and only a final mask image corresponding to an image rasterized through rasterization and optimization may be generated. The rasterized image cannot be directly restored to the mask shape, and additional iterative optimization or improvements may be needed to perform the restoration to the mask shape.

Assuming that there exists a transformation model between the rasterized image and the signed distance image, the rasterized image may be transformed or mapped to the signed distance image through the transformation model, and then the mask shape may be easily and precisely restored from the signed distance image. For example, the mask shape may be precisely restored by applying zero-level set interpolation to the signed distance image.

In the mask shape forming method according to some embodiments, deep learning may be performed on the transformation relationship between the rasterized image and the signed distance image corresponding thereto in order to infer the transformation model. A process of performing deep learning on the transformation relationship between the rasterized image and the signed distance image corresponding thereto may correspond to operation S150 of FIG. 1 of performing deep learning with respect to the transformation relationship between the first images and the second images. Through this deep learning, the transformation model between the rasterized image and the signed distance image may be inferred. Although FIG. 2A illustrates one rasterized image and one signed distance image, several hundreds to several thousands or more of rasterized images and several hundreds to several thousands or more of signed distance images corresponding thereto may be needed for deep learning and more accurate transformation model inference.

After the transformation model is inferred through deep learning, the rasterized image corresponding to the target pattern on the wafer may be transformed into the signed distance image by applying the transformation model, and then the mask shape may be restored from the signed distance image. A process of transforming the rasterized image into the signed distance image and restoring the mask shape from the signed distance image may correspond to operation S170 of FIG. 1 of forming the target shape on the mask.

Referring to FIG. 2B, as described above, a plurality of first images and a plurality of second images may be needed to infer a transformation model through deep learning. For example, a first image on the right upper side may be generated through rasterization and optimization with respect to a known mask shape like the left simulation illustration, and a second image on the right lower side may be generated through the SDC algorithm with respect to the known mask shape. The mask shape may have a vector format such as GDSII/OASIS. The first image is a rasterized image and may have a bitmap format, and the second image is a signed distance image and may have a bitmap format. Since the mask shape has already been known, optimization may be omitted during the generation of the first image, in some embodiments. As described above with reference to FIG. 2A, FIG. 2B illustrates low-pass filtering, but rasterization may include down sampling and parametrization in addition to low-pass filtering, according to some embodiments.

Through this process, first images and second images may be generated for a plurality of known mask shapes and constitute independent image domains, respectively, and then deep learning, for example, deep learning using the generative neural network algorithm, may be performed between the image domains, thereby inferring a transformation model between the first images and the second images corresponding thereto.

FIGS. 3A and 3B are flowcharts of operation S170 of FIG. 1 of forming the target shape on the mask, and FIG. 4 is a conceptual diagram for explaining operations of FIGS. 3A and 3B of forming the target shape on the mask. Descriptions of FIGS. 3A and 3B which are the same as those of FIGS. 1 through 2B are given briefly or omitted herein.

Referring to FIG. 3A, first, the mask shape corresponding to the target pattern on the wafer may be transformed into the target first image through rasterization and image correction (S172). The target first image may be, for example, a rasterized image, and may have a bitmap format. As described above, the target first image may be a mask image of irreversible transformation, and thus restoration from the target first image to the mask shape may be impossible or may be very difficult.

Next, based on deep learning, the target first image may be transformed into the target second image (S174). In detail, the target first image may be directly transformed or mapped into the target second image by using the transformation model between the first images and the second images corresponding thereto, which has been inferred in operation S150 of FIG. 1 of performing deep learning with respect to the transformation relationship between the first images and the second images. The target second image may correspond to, for example, a signed distance image, and may have a bitmap format.

Thereafter, the target second image may be transformed into the target pattern on the mask (S176). For example, when the target second image is a signed distance image, the target second image may be restored to the target shape on the mask through zero-level set interpolation. The target shape on the mask may finally correspond to the mask shape of a format such as GDSII/OASIS for forming the target pattern on the wafer.

Referring to FIG. 3B, when describing in more detail operation S172 of transforming the mask shape into the target first image through rasterization and image correction, before operation S172, an initial shape on the mask corresponding to the target pattern on the wafer is designed (S171). The design of the initial shape on the mask may correspond to an initial process performed when manufacturing a mask for forming a new target pattern on the wafer.

Thereafter, the initial shape on the mask undergoes low-pass filtering, down sampling, and/or parametrization to generate an initial first image (S172a). The respective processes of low-pass filtering, down sampling, and/or parametrization are the same as those described above with reference to FIG. 1. As described above, the collective of low-pass filtering, down sampling, and/or parametrization are referred to as rasterization.

After the initial first image is generated, the initial first image undergoes image correction to generate a target first image (S172b). The image correction may refer to optimization, as described above. The target first image may be a rasterized image, and may have a bitmap format. However, as described above, the target first image may be a mask image of irreversible transformation, and thus restoration from the target first image to the mask shape may be impossible or may be very difficult.

Referring to FIG. 4, when describing operation S170 of forming the target shape on the mask, the initial shape on the mask corresponding to the target pattern on the wafer may be designed first. For example, when the target pattern on the wafer is rectangular, the initial shape on the mask may also have a rectangular shape. Thereafter, rasterization may be performed on the initial shape on the mask. The rasterization may include low-pass filtering, down-sampling, and/or parametrization. However, for convenience of explanation, only low-pass filtering is illustrated. Through this rasterization, an initial first image Ii may be generated.

After the initial first image Ii is generated, optimization is performed on the initial first image Ii. Through optimization, a target first image It1 may be generated. The target first image It1 is a rasterized image and thus has a bitmap format, and may be a mask image of irreversible transformation. Continuously, a transformation model inferred through deep learning is applied to the target first image It1. The target first image It1 may be mapped or transformed by applying the transformation model, and thus a target second image It2 may be generated. The target second image It2 is, for example, a signed distance image and thus has a bitmap format, and may be a mask image of reversible transformation.

Thereafter, restoration may be performed on the target second image It2. Through the restoration, a target shape S on the mask may be generated. The target shape S on the mask may have, for example, a vector format such as GDSII/OASIS, and may be used in mask manufacture for forming the target pattern on the wafer.

Figure 5A:
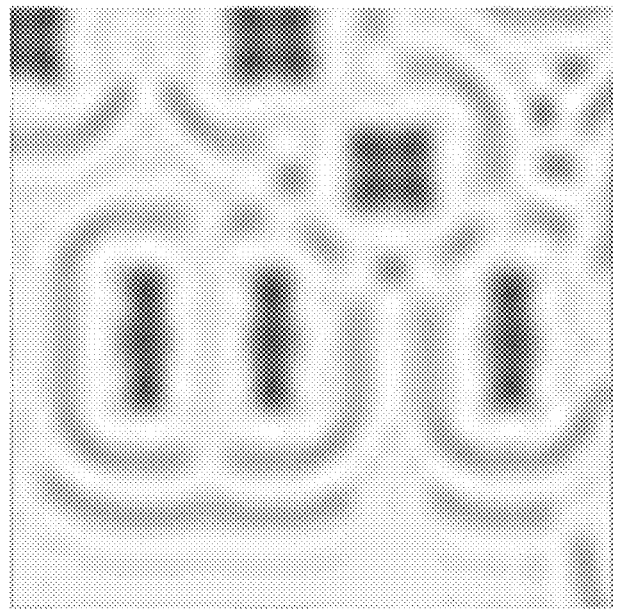
FIGS. 5A through 5C are simulation illustrations for showing an effect of the method of FIG. 1 of forming the shape on the mask.
Figure 5B:
Figure 5C:

FIGS. 5A through 5C are simulation illustrations for showing an effect of the mask shape forming method of FIG. 1. FIG. 5A is a simulation illustration of a rasterized image RI obtained via rasterization and optimization with respect to a mask shape, FIG. 5B is a simulation illustration of a first signed distance image SDI1 obtained by applying a transformation model inferred through deep learning to the rasterized image RI, and FIG. 5C is a simulation illustration of a second signed distance image SDI2 obtained by applying the SDC algorithm to the mask shape.

Referring to FIGS. 5A through 5C, the rasterized image RI, the first signed distance image SDI1, and the second signed distance image SDI2 may all have a bitmap format. However, the rasterized image RI may be a mask image of irreversible transformation that is unable to be restored to the mask shape, and the first signed distance image SDI1 and the second signed distance image SDI2 may be mask images of reversible transformation that are easily restored to the mask shape.

As can be seen through a comparison between the illustrations of FIGS. 5B and 5C, the first signed distance image SDI1 is substantially the same as the second signed distance image SDI2 to a level that cannot be distinguished by the human eye. An effect of the mask shape forming method according to some embodiments will now be described with reference to FIGS. 6A and 6B by comparing the first signed distance image SDI1 and the second signed distance image SDI2 with mask shapes restored from them to a more precise level.

Figure 6A:
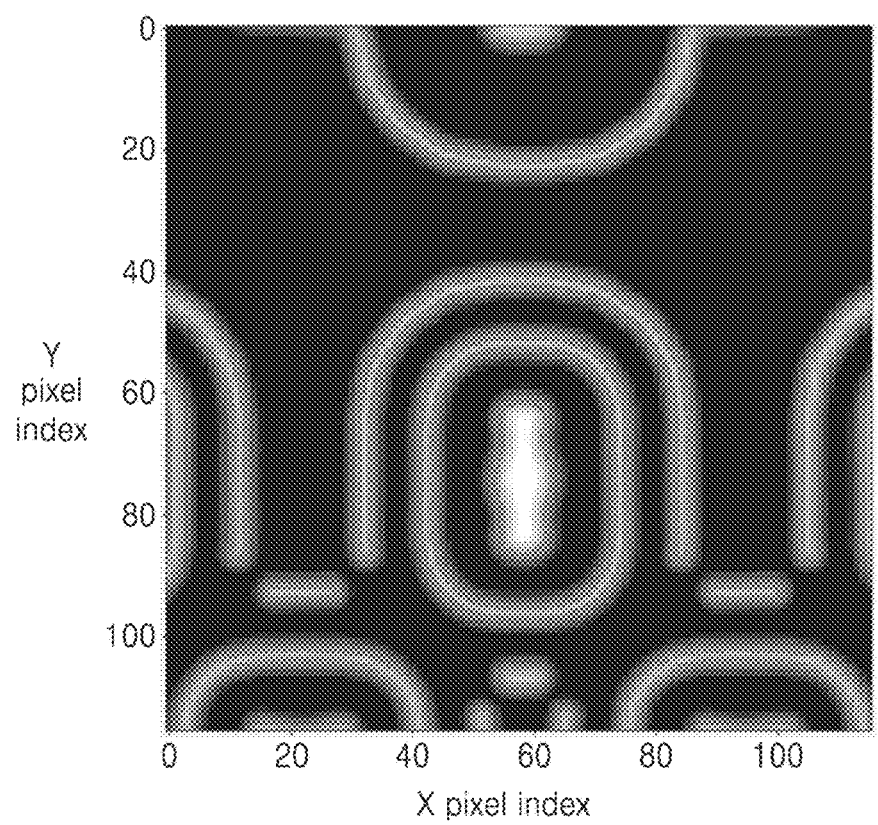
FIGS. 6A and 6B are a simulation illustration and a graph for showing an effect of the method of FIG. 1 of forming the shape on the mask.
Figure 6B:
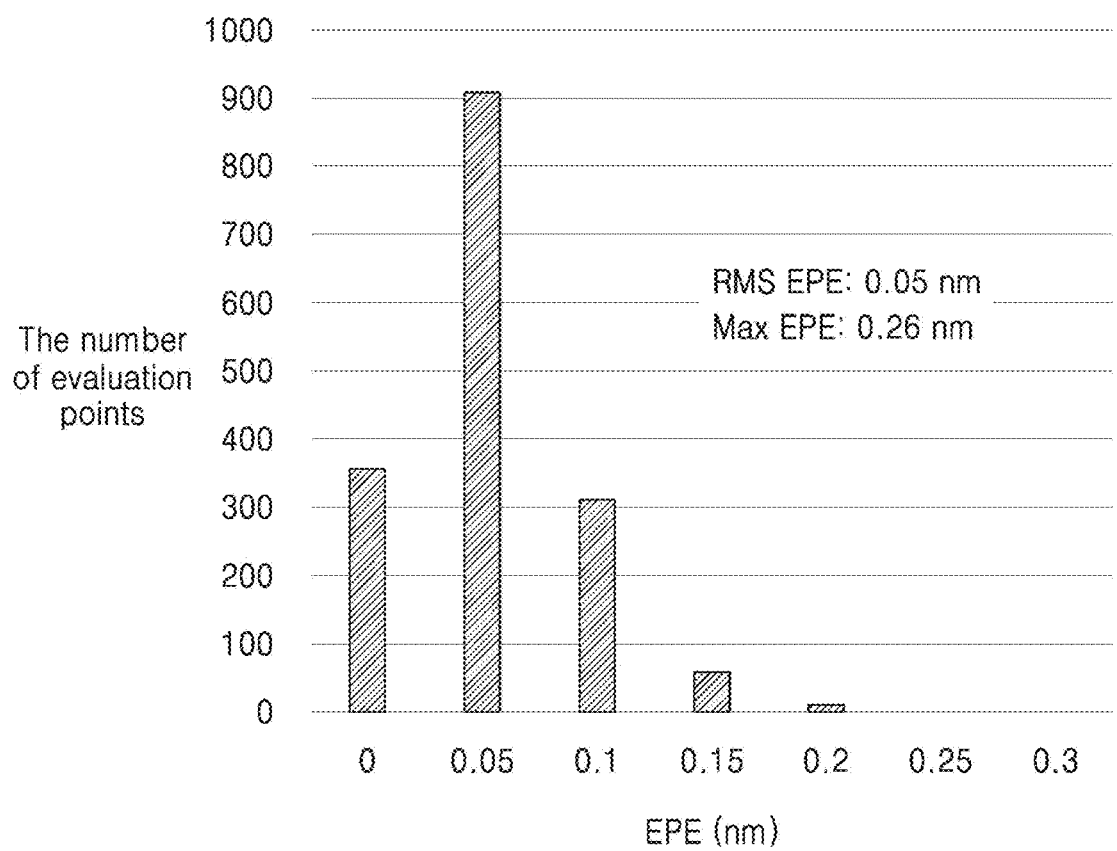

FIGS. 6A and 6B are a simulation illustration and a graph for showing an effect of the mask shape forming method of FIG. 1. FIG. 6A is a simulation illustration of a mask shape restored via interpolation by applying a marching squares algorithm to a signed distance image. In FIG. 6A, a white image may correspond to the signed distance image and minute dots around the edge of the white image may correspond to the mask shape restored through interpolation.

Referring to FIG. 6A, dots may include dots corresponding to a first mask shape restored from the first signed distance image SDI1 via interpolation and dots corresponding to a second mask shape restored from the second signed distance image SDI2 via interpolation. However, in FIG. 6A, the simulation illustration is shown in black and white, and the dots corresponding to the first mask shape and the dots corresponding to the first mask shape appear to be overlapped by each other at substantially the same location and are thus not distinguished from each other.

FIG. 6B is a graph for comparing how much the first mask shape and the second mask shape are different from each other. Referring to FIG. 6B, an edge placement error (EPE) representing how much distances of the dots in a normal direction of the mask shape are different may be calculated and checked. In FIG. 6B, the x-axis indicates EPE in nm units, and the y-axis indicates the number of dots having a corresponding EPE value. Each of the first signed distance image SDI1 and the second signed distance image SDI2 of FIGS. 5B and 5C may have a resolution of several nanometers (nm) or greater, and each of the first mask shape and the second mask shape restored therefrom may have a resolution of about 0.1 nm.

As can be seen from the graph, a Root Mean Square (RMS) EPE between the first mask shape and the second mask shape is about 0.05 nm, and a maximum EPE is about 0.26 nm. The difference to this level means that the first mask shape and the second mask shape are substantially the same as each other, and consequently, the mask shape forming method according to some embodiments is proven as a very effective mask shape restoring method.

In other words, the mask shape may be easily and precisely restored using the first signed distance image SDI1 of FIG. 5B, and the first signed distance image SDI1 may be easily and quickly obtained by applying the transformation model inferred through deep learning to the rasterized image RI. Consequently, in the mask shape forming method according to some embodiments, the first signed distance image SDI1 is generated from the rasterized image RI, based on deep learning, and the mask shape is restored from the first signed distance image SDI1 via interpolation, whereby the mask shape may be easily, quickly, and precisely restored. In addition, a process up to the restoration from the rasterized image RI to the mask shape may not need additional iterative optimization or improvement.

Figure 7:
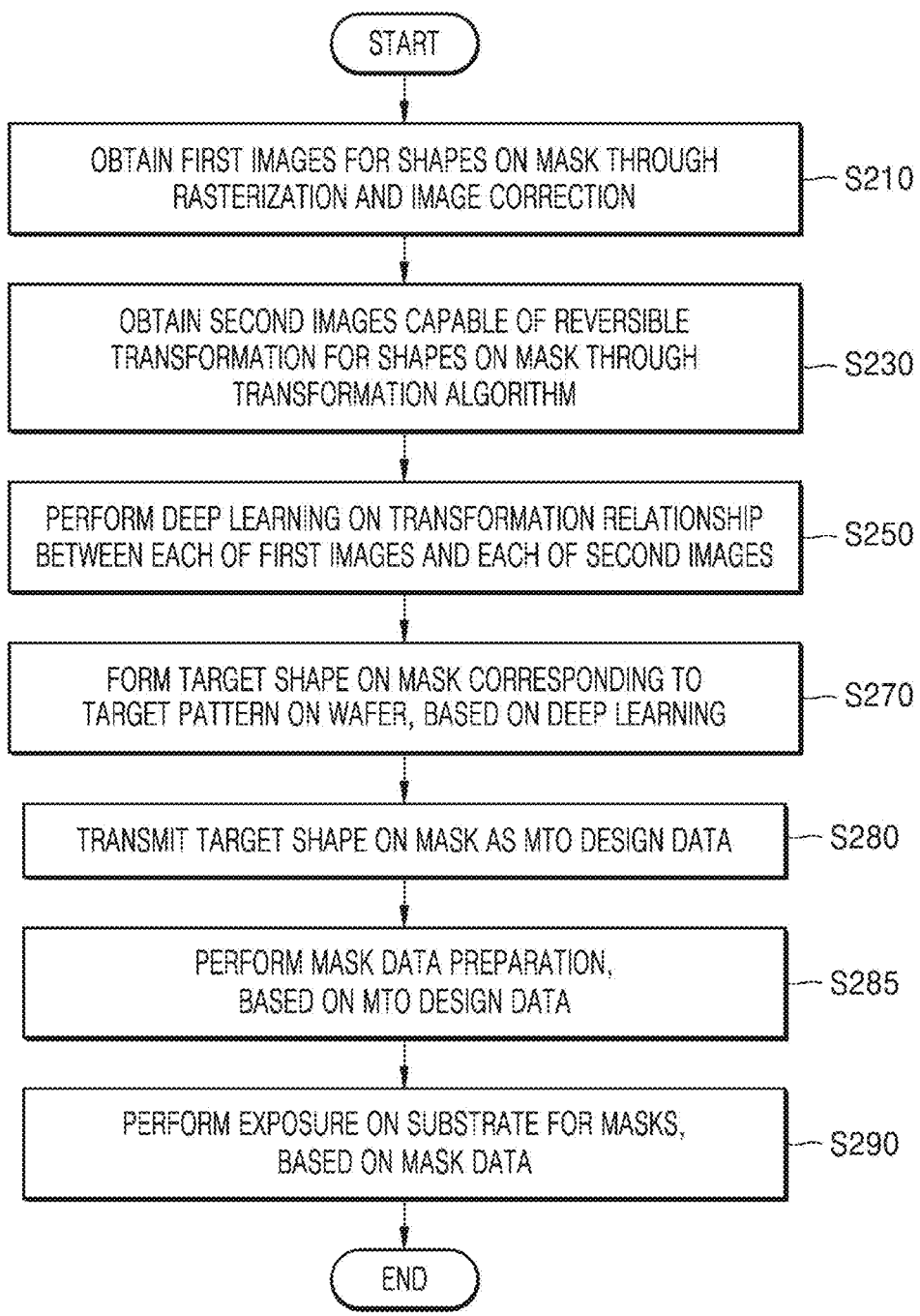
FIG. 7 is a flowchart of a mask manufacturing method according to some embodiments of the inventive concept.

FIG. 7 is a flowchart of a mask manufacturing method according to some embodiments of the inventive concept. A description of FIG. 7 which is the same as that of FIGS. 1 through 6B is given briefly or omitted herein.

Referring to FIG. 7, in the mask manufacturing method according to some embodiments, operation S210 of obtaining first images through to operation S270 of forming a target shape on a mask are sequentially performed. Operation S210 of obtaining the first images through to operation S270 of forming the target shape on the mask are the same as operation S110 of FIG. 1 of obtaining the first images through to operation S170 of FIG. 1 of forming the target shape on the mask. Accordingly, respective detailed descriptions of the operations will be omitted.

Thereafter, the target shape is transmitted as mask tapeout (MTO) design data (S280). In general, MTO may refer to requesting mask manufacture by handing over data in a final mask shape obtained through OPC or ILT to a mask manufacturing team. Accordingly, the MTO design data may finally correspond to data about the target shape on the mask. Because the target shape on the mask has a vector format such as GDS2II/OASIS, the MTO design data may also have the vector format such as GDS2II/OASIS. By reference, the vector format such as GDS2II/OASIS may correspond to a graphic data format for use in electronic design automation (EDA) software and the like.

After the MTO design data is transmitted, a mask data preparation (MDP) is performed (S285). The MDP may include, for example, format transformation called fracturing, augmentation of a barcode for mechanical reading, a standard mask pattern for inspection, job deck, etc., and automatic and manual verification. The job deck may refer to making a text file related to a series of instructions, such as layout information of multiple mask files, a reference dose, and an exposure speed or method.

The format transformation, namely, fracturing, may refer to a process of fracturing the MTO design data for each area and changing a format of the fractured MTO design data to a format for electronic beam exposure devices. The fracturing may include, for example, data manipulation such as scaling, sizing of data, rotation of the data, pattern reflection, or color inversion. During transformation through fracturing, data about many systematic errors that may be generated anywhere during delivery from design data to an image on a wafer may be corrected. The process of correcting the data about the systematic errors is called mask process correction (MPC), and may include, for example, linewidth control called CD control and an operation of increasing pattern layout precision. Accordingly, the fracturing may contribute to improvement in the quality of a final mask, and may be a process performed in advance to achieve MPC. The systematic errors may be caused due to distortion that occurs in an exposure process, a mask development and etching process, and a wafer imaging process.

The MDP may include MPC. The MPC refers to a process of correcting an error, namely, systematic errors, that is generated during an exposure process as described above. The exposure process may be a concept including all of electronic beam writing, development, etching, and baking. Data processing may be further performed before the exposure process. The data processing is a process of preprocessing mask data, and thus may include grammar check of mask data, exposure time prediction, and the like.

After the MDP, exposure is performed on a substrate for masks, based on the mask data (S290). The exposure may refer to, for example, electronic beam writing. The electronic beam writing may be conducted according to, for example, a gray writing method using a multi-beam mask writer (MBMW). The electronic beam writing may be conducted using a variable shape beam (VSB) exposure device.

After the MDP, a process of transforming the mask data into pixel data may be performed before an exposure process. The pixel data is directly used in actual exposure, and may include data about an image that is to be exposed, and data about a dose allocated to the image. The data about an image may be bitmap data into which shape data that is vector data is transformed through rasterization or the like.

After the exposure process, a series of processes may be conducted to thereby complete a mask. The series of processes may include, for example, development, etching, and cleaning. The series of processes for mask manufacture may include a measurement process, a defect inspection, a defect repairing process, or the like. The series of processes for mask manufacture may also include a pellicle coating process. The pellicle coating process refers to a process of attaching a pellicle to protect a mask surface from subsequent contamination during the delivery of a mask and the useful lifespan of the mask, when it is confirmed through final cleaning and inspection that there are no contaminants or chemical stains.

In the mask manufacturing method according to some embodiments, the mask may be an extreme ultra-violet (EUV) mask. However, the mask in the mask manufacturing method according to some embodiments is not limited to an EUV mask. For example, in the mask manufacturing method according to some embodiments, a mask for other wavelengths, such as a deep ultra-violet (DUV) mask, may be manufactured.

In the mask manufacturing method according to some embodiments, the transformation model for the transformation relationship between the first images (for example, rasterized images) and the second images (for example, signed distance images) may be inferred through deep learning, and the mask shape may be easily, quickly, and precisely restored from the mask image corresponding to the target pattern by using the transformation model. For example, the restoration from the mask image to the mask shape may undergo design of the initial shape on the mask corresponding to the target pattern, transformation to the target first image through rasterization and optimization or other improvement, transformation to the target second image by using the transformation model, and restoration of the target second image to the target shape on the mask, namely, the mask shape, through interpolation.

In the mask manufacturing method according to some embodiments, optimal mask data may be generated by transmitting the mask shape quickly and precisely restored through the above-described process as the MTO design data. Moreover, by manufacturing the mask through an exposure process, based on the optimal mask data, a good mask capable of optimally forming a target pattern on a wafer may be realized.

Various operations described herein, such as performing rasterization, image correction, transformations, deep learning, etc., may be performed by a processor circuit including one or more processors. The processor circuit may include one or more data processing circuits, such as a general purpose and/or special purpose processor, e.g., microprocessor and/or digital signal processor. The processor circuit may include one or more processors that are embodied by hardware, software, firmware, micro-code, etc. that support the operations of the one or more processors. The processor circuit is configured to execute the computer readable program code in memory to perform at least some of the operations and methods described herein. According to some embodiments, the memory may include a non-transitory computer-readable storage medium storing computer-readable program code therein that is executable by the processor circuit to perform various operations.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create functionality and/or structure for implementing the functions/acts specified in the block diagrams and/or flowchart block(s).

While the inventive concept has been particularly shown and described with reference to embodiments thereof, it will be understood that various changes in form and details may be made therein without departing from the scope of the following claims.

What is claimed is:

1. A method of forming a mask, the method comprising:
   obtaining first images by performing rasterization and image correction on shapes on the mask corresponding to first patterns on a wafer;
   obtaining second images by applying a transformation to the shapes on the mask;
   performing deep learning based on a transformation relationship between ones of the first images and ones of the second images corresponding to the first images;
   forming a target shape on the mask corresponding to a target pattern on the wafer, based on the deep learning; and
   manufacturing the mask based on the target shape on the mask,
   wherein the image correction comprises correcting the mask into a mask image corresponding to a required target pattern.

2. The method of claim 1, wherein the forming of the target shape on the mask comprises:
   transforming a shape of the shapes on the mask corresponding to the target pattern on the wafer into a target first image through rasterization and image correction;
   transforming the target first image into a target second image, based on the deep learning; and
   transforming the target second image into the target shape on the mask.

3. The method of claim 2, further comprising:
   before the transforming the shape of the shapes into the target first image, designing an initial shape on the mask corresponding to the target pattern,
   wherein the transforming the shape into the target first image comprises:
      generating an initial first image through low-pass filtering, down sampling, and parametrization based on the initial shape; and
      generating the target first image by performing image correction on the initial first image.

4. The method of claim 2,
   wherein the rasterization comprises low-pass filtering, down sampling, and parametrization, and
   wherein after the transforming into the target shape, additional image correction is not performed.

5. The method of claim 2,
   wherein the target first image has a bitmap format, and
   wherein the target second image has a bitmap format to which interpolation is applied.

6. The method of claim 5,
   wherein the transformation comprises a signed distance computation, and
   wherein the target second image comprises a signed distance image.

7. The method of claim 1,
   wherein the first images and the second images have a resolution of several nanometers (nm) or greater, and
   wherein the target shape has a resolution less than the resolution of the first images and the second images.

8. The method of claim 1, wherein the target shape has a vector format and includes a curvilinear shape.

9. The method of claim 1, wherein the deep learning uses a generative neural network algorithm.

10. The method of claim 1, wherein the target shape is transmitted as Mask Tape-Out (MTO) design data and used in the manufacturing of the mask.

11. A method of forming a mask, the method comprising:
    designing initial shapes on the mask corresponding to first patterns on a wafer;
    obtaining first images that have a bitmap format by performing rasterization and image correction on the initial shapes;
    obtaining signed distance images by applying a signed distance computation to the initial shapes on the mask corresponding to the first patterns on the wafer, wherein the signed distance computation comprises a sign indicating an inside or outside of the mask shape;
    performing deep learning with respect to a transformation relationship between ones of the first images and ones of the signed distance images corresponding to the first images;
    transforming an initial shape of the initial shapes on the mask corresponding to a target pattern on the wafer into a target first image by performing rasterization and image correction on the initial shape on the mask corresponding to the target pattern on the wafer;

transforming the target first image into a target signed distance image, based on the deep learning;

transforming the target signed distance image into a target shape on the mask; and manufacturing the mask comprising the target shape on the mask.

12. The method of claim 11, wherein the rasterization comprises low-pass filtering, down sampling, and parametrization, and wherein after the transforming the target signed distance image into the target shape, additional image correction is not performed.

13. The method of claim 11, wherein the target signed distance image has a bitmap format to which interpolation is applied, and wherein the target shape has a vector format and includes a curvilinear shape.

14. The method of claim 11, wherein the deep learning uses a generative neural network algorithm.

15. A mask manufacturing method comprising:

obtaining first images by performing a first rasterization and a first image correction on shapes on a mask corresponding to first patterns on a wafer, wherein the image correction comprises correcting the mask into a mask image corresponding to a required target pattern;

obtaining second images by applying a transformation to the shapes on the mask;

performing deep learning with respect to a transformation relationship between ones of the first images and ones of the second images corresponding to the first images;

forming a target shape on the mask corresponding to the target pattern on the wafer, based on the deep learning;

transmitting the target shape as Mask Tape-Out (MTO) design data;

preparing for mask data, based on the MTO design data; and performing exposure on a mask substrate of the mask, based on the mask data.

16. The mask manufacturing method of claim 15, wherein the forming of the target shape on the mask comprises:

transforming a shape of the shapes on the mask corresponding to the target pattern on the wafer into a target first image through a second rasterization and a second image correction;

transforming the target first image into a target second image, based on the deep learning; and transforming the target second image into the target shape on the mask.

17. The mask manufacturing method of claim 16, wherein the second rasterization comprises low-pass filtering, down sampling, and parametrization, and wherein after the transforming the target second image into the target shape, additional image correction is not performed.

18. The mask manufacturing method of claim 16, wherein the target first image has a bitmap format, wherein the target second image has a bitmap format to which interpolation is applied, wherein the transformation to the shapes is a signed distance computation, and wherein the target second image is a signed distance image.

19. The mask manufacturing method of claim 15, wherein the target shape has a vector format and includes a curvilinear shape.

20. The mask manufacturing method of claim 15, wherein the deep learning uses a generative neural network algorithm.

* * * * *